US010741660B2

(12) United States Patent
Loubet et al.

(10) Patent No.: US 10,741,660 B2
(45) Date of Patent: Aug. 11, 2020

(54) NANOSHEET SINGLE GATE (SG) AND EXTRA GATE (EG) FIELD EFFECT TRANSISTOR (FET) CO-INTEGRATION

(71) Applicant: INTERNATIONAL BUSINESS MACHINES CORPORATION, Armonk, NY (US)

(72) Inventors: Nicolas J. Loubet, Guilderland, NY (US); Siva Kanakasabapathy, Pleasanton, CA (US); Kangguo Cheng, Schenectady, NY (US); Jingyun Zhang, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 10 days.

(21) Appl. No.: 16/006,173

(22) Filed: Jun. 12, 2018

(65) Prior Publication Data

US 2019/0378906 A1    Dec. 12, 2019

(51) Int. Cl.
*H01L 29/423* (2006.01)
*H01L 21/311* (2006.01)
*H01L 21/28* (2006.01)
*H01L 29/66* (2006.01)

(52) U.S. Cl.
CPC .. *H01L 29/42392* (2013.01); *H01L 21/28158* (2013.01); *H01L 21/31144* (2013.01); *H01L 29/6653* (2013.01); *H01L 29/66545* (2013.01)

(58) Field of Classification Search
CPC ......... H01L 29/42392; H01L 21/31144; H01L 21/28158; H01L 29/66545; H01L 29/6653; H01L 27/092; H01L 21/823857; H01L 21/823807; H01L 21/823842; H01L 29/66772; H01L 29/66742; H01L 29/78654; H01L 29/78684; H01L 29/78696; H01L 29/1079; H01L 29/401; H01L 29/0673; H01L 29/66439; H01L 29/775; B82Y 10/00
See application file for complete search history.

(56) References Cited

U.S. PATENT DOCUMENTS

| | | | |
|---|---|---|---|
| 9,287,357 B2 | 3/2016 | Rodder et al. | |
| 9,425,291 B1 | 8/2016 | Balakrishnan et al. | |
| 9,490,335 B1 | 11/2016 | Doris et al. | |
| 9,570,609 B2 | 2/2017 | Obradovic et al. | |
| 9,583,486 B1 | 2/2017 | Ando et al. | |

(Continued)

*Primary Examiner* — Stephen W Smoot
*Assistant Examiner* — Vicki B. Booker
(74) *Attorney, Agent, or Firm* — Tutunjian & Bitetto, P.C.; Vazken Alexanian

(57) ABSTRACT

A method of forming a semiconductor device that includes providing a first stack of nanosheets having a first thickness and a second stack of nanosheets having a second thickness; and forming a oxide layer on the first and second stack of nanosheets. The oxide layer fills a space between said nanosheets in the first stack, and is conformally present on the nanosheets in the second stack. The method further includes forming a work function metal layer on the first and second stack of nanosheets. In some embodiments, the work function metal layer is present on only exterior surfaces of the first stack to provide a single gate structure and is conformally present about an entirety of the nanosheets in the second stack to provide a multiple gate structure.

7 Claims, 9 Drawing Sheets

(56) References Cited

U.S. PATENT DOCUMENTS

2012/0007052 A1\* 1/2012 Hobbs ............... H01L 29/42392
  257/24
2016/0111421 A1 4/2016 Rodder et al.
2017/0104060 A1\* 4/2017 Balakrishnan ...... H01L 29/0673

\* cited by examiner

NANOSHEET SINGLE GATE (SG) AND EXTRA GATE (EG) FIELD EFFECT TRANSISTOR (FET) CO-INTEGRATION

BACKGROUND

Technical Field

The present disclosure relates to semiconductor devices, and more particularly to semiconductor devices including channel regions integrated within nano-sheets.

Description of the Related Art

With the continuing trend towards miniaturization of integrated circuits (ICs), there is a need for transistors to have higher drive currents with increasingly smaller dimensions. The use of non-planar semiconductor devices such as, for example, nanowire and nano-sheet transistors may be the next step in the evolution of complementary metal oxide semiconductor (CMOS) devices.

SUMMARY

In one aspect, a method of forming an electrical device is provided that produces one stack of nanosheets having a channel region contacted by a single gate structure; and a second stack of nanosheets having a channel region contacted by a multi-gate structure (hereafter referred to as extra gate structure). In one embodiment, the method includes providing a first stack of nanosheets having a first thickness and a second stack of nanosheets having a second thickness, wherein the second thickness is less than the first thickness; and forming a dielectric layer on the first and second stack of nanosheets, wherein the dielectric layer fills a space between said nanosheets in the first stack, and is conformally present on the nanosheets in the second stack. The method further includes forming a work function metal layer on the first and second stack of nanosheets. In some embodiments, the work function metal layer is present on only exterior surfaces of the first stack to provide a single gate structure and the work function metal layer is conformally present about an entirety of the nanosheets in the second stack to provide a multiple gate structure.

In another embodiment, a method of forming an electrical device is provided that includes providing a first stack of nanosheets having a first thickness and a second stack of nanosheets having a second thickness, wherein the second thickness is less than the first thickness. The method may continue with forming a dielectric layer on the first and second stack of nanosheets, wherein the dielectric layer fills a space between said nanosheets in the first stack, and is conformally present on the nanosheets in the second stack. The dielectric layer may be removed from the first stack of nanosheets to open the space between the nanosheets in the first stack, wherein the dielectric layer remains conformally present on the nanosheets in the second stack. A work function metal layer is formed on the first and second stack of nanosheets. The work function metal layer is present filling an entirety of the space between the nanosheets in the first stack. The work function metal layer is conformally present about an entirety of the nanosheets in the second stack, wherein a space remain between stacked nanosheets in the second stack.

In another embodiment, the method of forming the electrical device includes providing a first stack of nanosheets having a first thickness and a second stack of nanosheets having a second thickness, wherein the second thickness is less than the first thickness; and forming a metal nitride layer on the first and second stack of nanosheets. In some embodiments, the metal nitride layer fills a space between the nanosheets in the first stack, and is conformally present on the nanosheets in the second stack. The metal nitride layer can be removed from the second stack of nanosheets. An oxide layer is formed on the second stack of nanosheets, and the metal nitride layer is removed from the first stack of nanosheets. A work function metal layer may be formed on the first and second stack of nanosheets, wherein the work function metal layer is conformally present about an entirety of the nanosheets in the second stack to provide a multiple gate structure.

In another aspect, a semiconductor device is provided. In one embodiment, the semiconductor device comprises a first stack of nanosheets on a first portion of a substrate, and a second stack of nanosheets on a second portion of the substrate. The nanosheets in the first stack have a greater thickness than the nanosheets in the second stack. Therefore, the space separating adjacently stacked nanosheets in the second stack is greater than the space separating the adjacently stacked nanosheets in the first stack. A first gate structure is present on the first stack of nanosheets. The first gate structures is a singular gate structure including a first high-k dielectric that is conformally present on the nanosheets in the first stack; a dielectric layer filling the space between the adjacently stacked nanosheets; and a first work function metal layer on exterior sidewalls of the first stack and the dielectric layer filling the space between the adjacently staked nanosheets in the first stack. A second gate structure is present on the second stack of nanosheets. The second gate structure is a multi-gate (also referred to as extra-gate) structure including a second high-k dielectric that is conformally present on the nanosheets in the second stack; a dielectric layer filling the space between the adjacently stacked nanosheets; and a second work function metal layer on exterior sidewalls of the second stack and the dielectric layer filling the space between the adjacently staked nanosheets in the second stack.

BRIEF DESCRIPTION OF DRAWINGS

The disclosure will provide details in the following description of preferred embodiments with reference to the following figures wherein.

DETAILED DESCRIPTION

Figure 1:
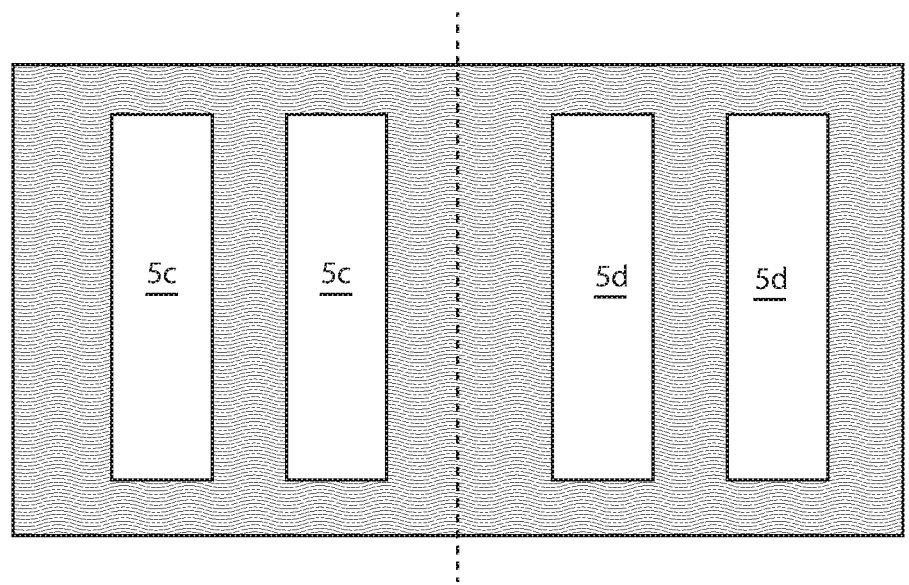
FIG. 1 is a top down view of a plurality of nanosheets, in which a first set of the nanosheets is used to for providing high voltage single gate (SG) nanosheet semiconductor devices having a thick oxide layer within the gate structure, and a second set of the nanosheets is used for providing extra gate (EG) nanosheet semiconductor devices having a thin oxide layer within the gate structure.

Detailed embodiments of the claimed methods, structures and computer products are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. For purposes of the description hereinafter, the terms "upper", "over", "overlying", "lower", "under", "underlying", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In one aspect, embodiments of the present disclosure describes nanosheet transistors and methods of forming nanosheet transistors. Nanosheet (nanowire) MOSFET is a candidate for future CMOS technology. Nanosheet MOSFETs can provide better gate electrostatic control and larger effective device width per footprint (multiple nanosheets in one stack). In some embodiments, it can be desirable to have both thin and thick oxide transistors using nanosheet technology simultaneously in the same device, e.g., on the same supporting substrate simultaneously. Further details regarding the method and structures of the present disclosure are now described with reference to FIGS. 1-17

FIG. 1 is a top down view of a plurality of nanosheets $10a$, $10b$, in which a first set of the nanosheets $10a$ is used to for providing high voltage single gate (SG) nanosheet semiconductor devices having a thick oxide layer within the gate structure, and a second set of the nanosheets $10b$ is used for providing extra gate (EG) nanosheet semiconductor devices having a thin oxide layer within the gate structure.

Figure 2:
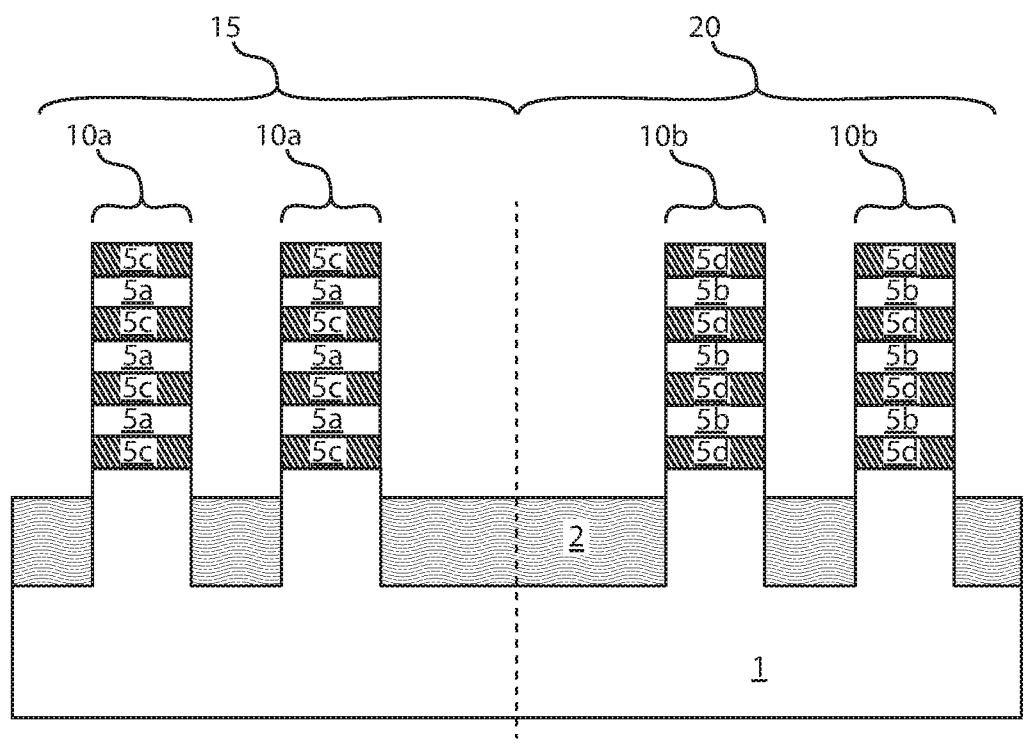
FIG. 2 is a side cross-sectional view of the stacks of nanosheets depicted in FIG. 1.

FIG. 2 is a side cross-sectional view of the stacks of nanosheets $10a$, $10b$ depicted in FIG. 1. The cross-section depicted in FIG. 2 is through the channel region portions of the nanosheets $10a$, $10b$. The cross-section depicted in FIG. 2 is following removal of a sacrificial gate structure as part of a replacement gate process flow, which may also be referred to as a gate last process flow.

The stacks of nanosheets $10a$, $10b$ are depicted being present on a supporting substrate 1. In some embodiments, each stack of nanosheets $10a$, $10b$ includes at least two semiconductor materials $5a$, $5b$, $5c$, $5d$ that are present overlying the substrate 1. The substrate 1 may be composed of a supporting material 1, such as a semiconductor material, e.g., silicon, or dielectric material, such as silicon oxide or silicon nitride.

The stack of nanosheets $10a$, $10b$ each include at least two semiconductor materials $5a$, $5b$, $5c$, $5d$ is typically composed of two alternating materials. For example, the first semiconductor material $5a$, $5b$ that is present on the substrate 1 may be composed of a silicon and germanium containing semiconductor material, such as silicon germanium (SiGe), whereas the second semiconductor material $5c$, $5d$ that is present on the first semiconductor material $5a$, $5b$ may be composed of a germanium free silicon containing semiconductor material, such as silicon (Si). It is noted that this is only one example of semiconductor materials that may be used for the at least two semiconductor materials $5a$, $5b$, $5c$, $5d$. Any semiconductor material composition may be used for each of the at least two semiconductor materials $5a$, $5b$, $5c$, $5d$ so long as at least one of the compositions selected allow for selective etching between at least two of them. Any type IV semiconductor composition combination and/or III-V semiconductor composition combination is suitable for use with the present disclosure. For example, the compositions selected for the at least two semiconductor materials include Si, SiGe, SiGeC, SiC, single crystal Si, polysilicon, i.e., polySi, epitaxial silicon, i.e., epi-Si, amorphous Si, i.e., a:Si, germanium, gallium arsenide, gallium nitride, cadmium telluride and zinc sellenide.

Although FIG. 2 only depicts two semiconductor material layers $5a$, $5b$, $5c$, $5d$ in each stack $10a$, $10b$, it is noted that the present disclosure is not limited to only this example. Any number of semiconductor material layers $5a$, $5b$, $5c$, $5d$ may be present in each stack 10.

The stack $10a$, $10b$ of the at least two semiconductor materials $5a$, $5b$, $5c$, $5d$ may be formed using a deposition process, such as chemical vapor deposition (CVD). The thickness of each of the at least two semiconductor material layers $5a$, $5b$, $5c$, $5d$ may range from 1 nm to 30 nm. In another embodiment, the thickness of each of the at least two semiconductor material layers $5a$, $5b$, $5c$, $5d$ may range from 5 nm to 20 nm.

Following deposition, the semiconductor material layers $5a$, $5b$, $5c$, $5d$ may be patterned to provide the geometry of the stack. In some embodiments, the semiconductor material layers $5a$, $5b$, $5c$, $5d$ may be patterned using deposition, photolithography and subtractive etch processing. In one example, the stack $10a$, $10b$ may have a height $H_1$ ranging from 5 nm to 200 nm, and a width ranging from 5 nm to 60 nm.

In the following description, the semiconductor material layers identified by reference numbers $5a$ and $5b$ may also be referred to as "nanosheets", and the semiconductor material layers identified by reference numbers $5c$ and $5d$ may be referred to as "sacrificial nanosheets".

Isolation regions 2 may be composed of a dielectric material, e.g., silicon oxide. The isolation regions 2 may be formed using a deposition process, such as chemical vapor deposition (CVD).

Still referring to FIG. 2, as noted above, the cross-section that is depicted in through the channel following removal of the replacement gate structure, i.e., sacrificial gate structure, of a replacement gate process. By "replacement" it is meant that the structure is present during processing of the semiconductor device, but is removed from the semiconductor device prior to the device being completed. As used herein, the term "replacement gate structure" denotes a sacrificial structure that dictates the geometry and location of the later formed functioning gate structure. The "functional gate structure" operates to switch the semiconductor device from an "on" to "off" state, and vice versa.

In one embodiment, the sacrificial material that provides the replacement gate structure may be composed of any material that can be etched selectively to the at least one of the material layers of the stacks $10a$, $10b$ of the at least two semiconductor materials $5a$, $5b$, $5c$, $5d$, i.e, the stacks $10a$, $10b$ of the nanosheets $5a$, $5b$, and the sacrificial nanosheets $5c$, $5d$. In one embodiment, the replacement gate structure may be composed of a silicon-including material, such as polysilicon. In another embodiment, the replacement gate structure may be composed of a dielectric material, such as an oxide, nitride or oxynitride material, or amorphous carbon. The replacement gate structure may be formed using deposition (e.g., chemical vapor deposition) photolithography and etch processes (e.g., reactive ion etching). A spacer can be formed on the sidewall of the replacement gate structure.

In some embodiments, before removing the replacement gate structure, source and drain regions are formed for each set of stacks $10a$, $10b$, in which the source and drain regions are positioned on opposing sides of the replacement gate structure. In some embodiments, the portions of the stacks $10a$, $10b$ that extend beyond the spacer may be etched prior to forming the source and drain regions. As used herein, the term "drain" means a doped region in semiconductor device located at the end of the channel region, in which carriers are flowing out of the transistor through the drain. The term "source" is a doped region in the semiconductor device, in which majority carriers are flowing into the channel region.

The source and drain regions may be composed of epitaxial semiconductor material that is doped to an n-type or p-type dopant. The term "epitaxial semiconductor material" denotes a semiconductor material that has been formed using an epitaxial deposition or growth process. "Epitaxial growth and/or deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

In some embodiments, the epitaxial semiconductor material that provides the source and drain regions may be composed of silicon (Si), germanium (Ge), silicon germanium (SiGe), silicon doped with carbon (Si:C), or the epitaxial semiconductor material that provides the source and drain regions may be composed of a type III-V compound semiconductor, such as gallium arsenide (GaAs).

In some embodiments, after forming the source and drain regions, the replacement gate structure may be removed. In some embodiments, removing the replacement gate structure may begin with forming an interlevel dielectric layer overlying at least the source and drain regions, and planarizing the interlevel dielectric layer to expose an upper surface of the replacement gate structure. The replacement gate structure may be removed using a wet or dry etch process. In one embodiment, the replacement gate structure may be removed by at least one of an anisotropic etch process, such as reactive ion etch (RIE), or an isotropic etch process, such as a wet chemical etch. Removing the replacement gate structure provides a gate opening to the channel region portions of the stacks of nanosheets $10a$, $10b$.

Figure 3:
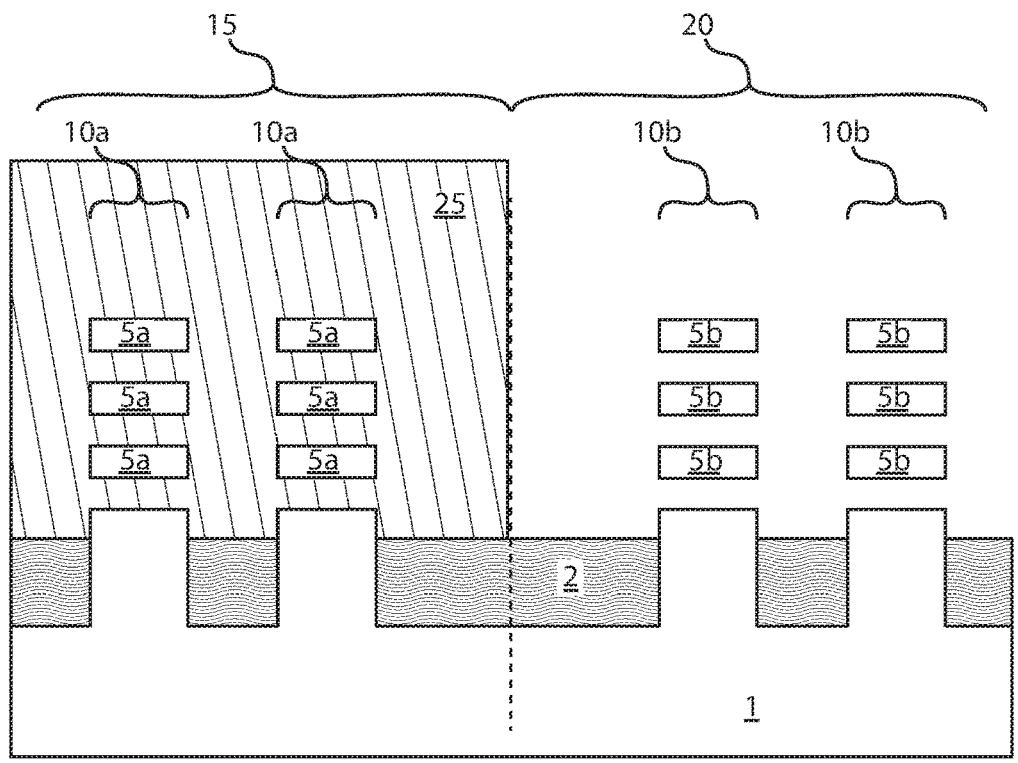
FIG. 3 is a side cross-sectional view depicting removing a sacrificial nanosheet from both stacks on nanosheets in the single gate (SG) and extra gate (EG) regions of the substrate; and forming a bock mask over the nanosheets in the single gate (SG) region.

FIG. 3 depicting removing a sacrificial nanosheet $5c$, $5d$ from both stacks $10a$, $10b$ of nanosheets $5a$, $5b$ in the single gate (SG) region 15 and extra gate (EG) region 20 of the substrate 1. In some embodiments, the sacrificial nanosheets $5c$, $5d$ of the stack $10a$, $10b$ are removed selectively to at least a remaining material composition that provides suspended channel structures, i.e., the nanosheets $5a$, $5b$. For example, in one embodiment when the semiconductor material of the nanosheets $5a$, $5b$ is composed of silicon germanium (SiGe) and the sacrificial nanosheets $5c$, $5d$ are composed of silicon, the sacrificial nanosheets $5b$ may be removed selectively to the semiconductor material of the nanosheets $5a$, $5b$ with an etch process, such as a wet chemical etch.

In this example, following removal of one of the sacrificial nanosheets $5c$, $5d$ of the stacks $10a$, $10b$, a suspended channel structure is provided by the nanosheets $5a$, $5b$ that remain. By "suspended channel" it is meant that at least one semiconductor material layer, e.g., nanosheets 5a, 5b, is present overlying the substrate 1, wherein the sidewalls of the suspended channel are supported, e.g., anchored, in the spacer that was previously formed on the sidewall of the replacement gate structure. As noted, the suspended channels are provided by nanosheets 5a, 5b. The term "nanosheet" denotes a substantially two dimensional structure with thickness in a scale ranging from 1 to 100 nm. The width and length dimensions of the nanosheet may be greater than the width dimensions.

FIG. 3 also depicts forming a bock mask 30 over the nanosheets 5a in the single gate (SG) region 15. The block mask 30 may comprise soft and/or hardmask materials and can be formed using deposition, photolithography and etching. In one embodiment, the block mask 30 is a hardmask composed of an organic planarization layer (OPL). The organic planarization layer (OPL) may be deposited on the structure depicted in FIG. 2. Following the formation of the OPL layer, an anti-reflection coating (ARC) or low temperature oxide (LTO) layer is deposited followed by a resist mask. The organic planarization layer (OPL) layer may be composed of an organic polymer that may include polyacrylate resin, epoxy resin, phenol resin, polyamide resin, polyimide resin, unsaturated polyester resin, polyphenylenether resin, polyphenylenesulfide resin, or benzocyclobutene (BCB). The OPL layer should be baked at a temperature at or above the subsequent processing steps to ensure no out-gassing and contamination. In some embodiments, the organic planarization layer (OPL) 16 is deposited from solution, e.g., by spin on deposition, and is baked at high temperature.

In the embodiments that employ a low temperature oxide, the low temperature oxide, e.g., silicon oxide ($SiO_2$), can be deposited by chemical vapor deposition (CVD) at temperatures of less than 400° C.

In the embodiments, that employ an anti-reflective coating, the anti-reflective coating (ARC) can be composed of silicon oxynitride (SiON) that is deposited using chemical vapor deposition (CVD), such as plasma enhanced chemical vapor deposition (PECVD) or low temperature chemical vapor deposition.

The resist mask may be patterned to protect the portion of the OPL, as well as the LTO and/or SiARC, that is present overlying the single gate (SG) region 15. The exposed portion of the OPL layer, as well as the exposed portions of the LTO and/or SiARC layer, are then removed by an etch process. The resist mask may then be stripped. The remaining portion of the OPL layer provides the block mask 30 that is depicted in FIG. 3.

Figure 4:
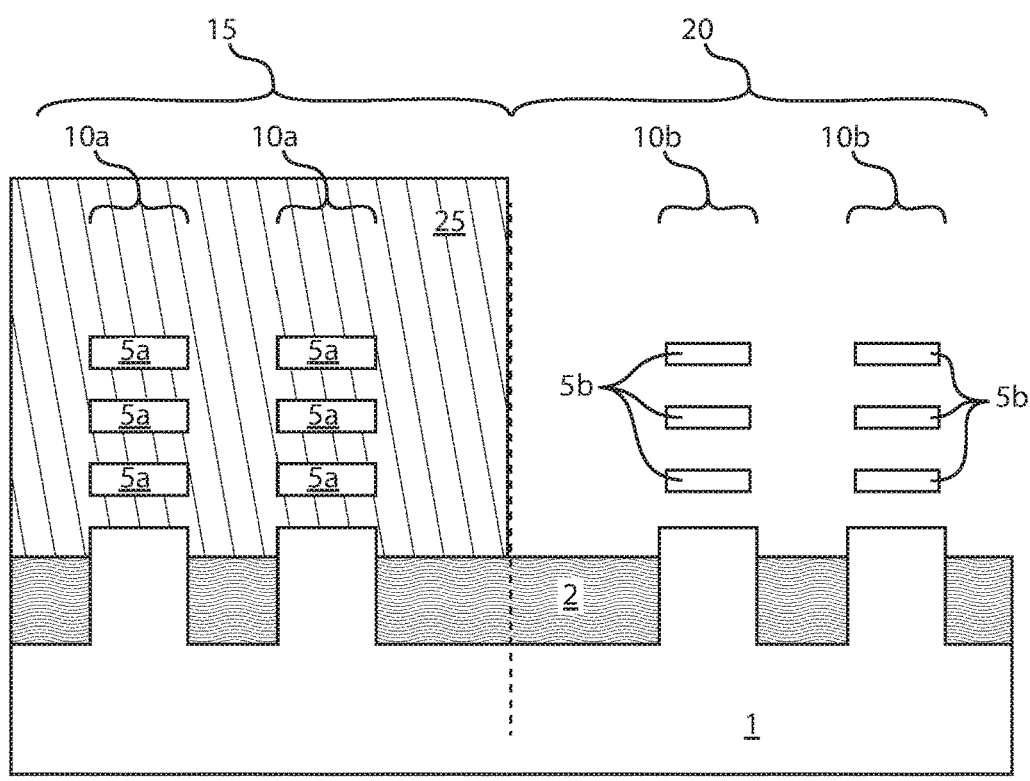
FIG. 4 is a side cross-sectional view depicting thinning of the channel region portions of the suspended nanosheets in the extra gate (EG) regions of the substrate.

FIG. 4 depicts thinning of the channel region portions of the suspended nanosheets 5b in the extra gate (EG) region 20 of the substrate 1. FIG. 4 depicts that the nanosheets 5a that are present in the single gate (SG) region 15 of the substrate 1 are protected by the block mask 30, while the nanosheets 5b that are present in the extra gate (EG) region 20 of the substrate 1 are exposed. The exposed nanosheets 5b may be thinned by a process that includes controlling thinning of the silicon (Si) containing nanosheets 5b, which can include ozone ($O_3$) oxidation, SC1 chemistry oxidation and/or dry oxidation. In one embodiment, oxidation of the silicon containing surface of the exposed nanosheets 5b includes the application of ozone ($O_3$) gas at room temperature, e.g., 20°-25° C., or at elevated temperature.

In another embodiment, the controlled thinning of the silicon containing nanosheets 5b can include the application of an SC-1 chemistry, which may be part of an RCA clean. For example, the first step of the RCA clean that includes ammonium hydroxide and hydrogen peroxide may be referred to as "SC-1" (standard clean #1). SC-1 includes of a mixture of ammonium hydroxide and hydrogen peroxide and deionized water. A typical concentration ratio for the mix is 1:1:5 $NH_4OH:H_2O_2:H_2O$, although ratios as low as 0.05:1:5 are suitable for cleaning the substrate 5. SC-1 typically operates in a temperature ranging from 50° C. to 70° C. The second step of the RCA clean that includes the aqueous mixture of hydrochloric acid and an oxidizing agent may be may be referred to as "SC-2" (standard clean #2). SC-2 includes a mixture of hydrochloric acid, hydrogen peroxide, and deionized water. A typical concentration ratio for the mix is 1:1:5 $HCl:H_2O_2:H_2O$. SC-2 is typically operated in the temperature range of 50–70° C.

In yet another example, the controlled oxidation may be provided by thermal oxidation, e.g., wet and/or dry thermal oxidation. Thermal oxidation of the exposed silicon containing nanosheets 5b can be performed at a temperature between 800° C. and 1200° C., resulting in so called High Temperature Oxide layer (HTO). In some embodiments, the thermal oxidation process may use either water vapor or molecular oxygen as the oxidant.

The aforementioned processes can form a thin oxide, e.g., silicon oxide ($SiO_2$), on the exposed surfaces of the silicon containing nanosheets 5b, which can have a thickness ranging from 1 nm to 5 nm in thickness. In some embodiments, the thickness of the oxide formed on the exposed surfaces of the silicon containing nanosheets 5b can range from 1 nm to 2 nm. The oxide is formed on all exposed surfaces of the silicon containing nanosheets 5b. The thickness of the oxide formed on the exposed surfaces of the silicon containing nanosheets can be conformal.

In some embodiments, following the formation of the oxide surface, e.g., thermal oxide, on the exposed surfaces of the silicon containing nanosheets 5b, an etch process may remove the oxide surface selectively to the non-oxidized portion of the silicon containing nanosheets 5b. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 10:1 or greater, e.g., 1000:1. For example, the etch process may remove the exposed oxide surface, e.g., thermal oxide, on the exposed surfaces of the silicon containing nanosheets 5b selectively to the non-oxidized portion of the silicon containing nanosheets 5b that is underlying the oxidized portion. The etch process may be a dry etch, or a wet etch. For example, reactive ion etch or plasma gas etching can remove the oxidized surfaces of the nanosheets 5b that are exposed. In some embodiments, removing the oxide reduces the dimensions of the nanosheets by 1 nm to 5 nm. For example, the nanosheet dimensions may be reduced by width and height (thickness) by 1 nm to 5 nm. In another embodiment, removing the oxide reduces the dimensions of the nanosheets by 1 nm to 2 nm.

Figure 5:
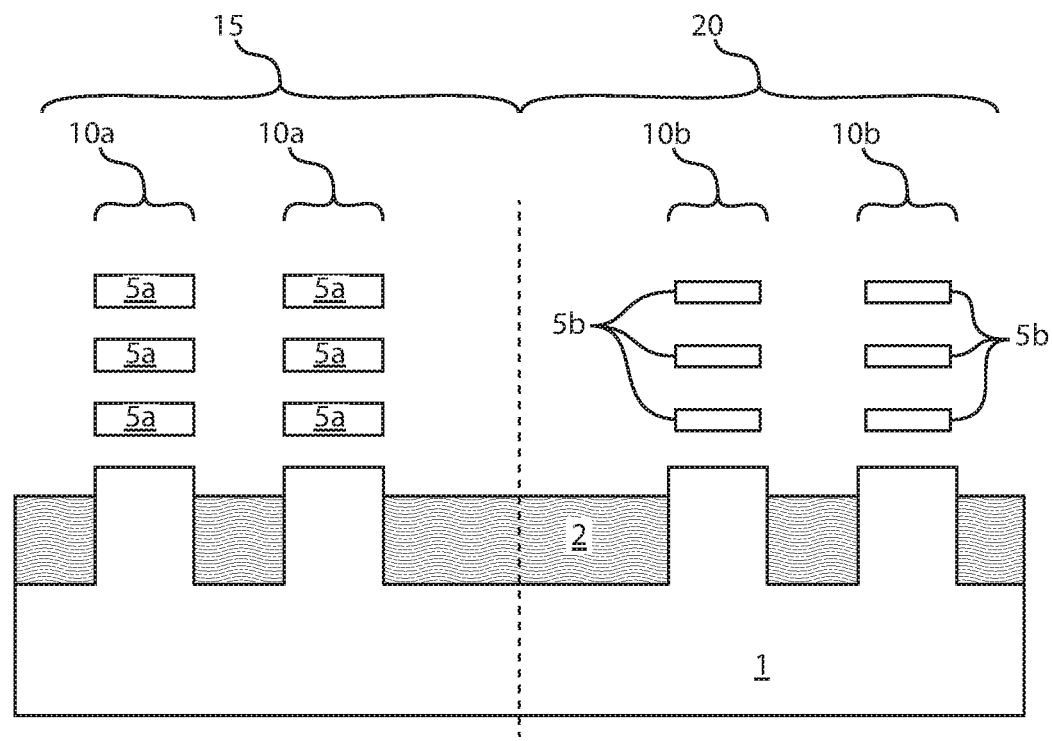
FIG. 5 is a side cross-sectional view of removing the block mask from the structure depicted in FIG. 4.

FIG. 5 depicts removing the block mask 30 from the structure depicted in FIG. 4.

Figure 6:
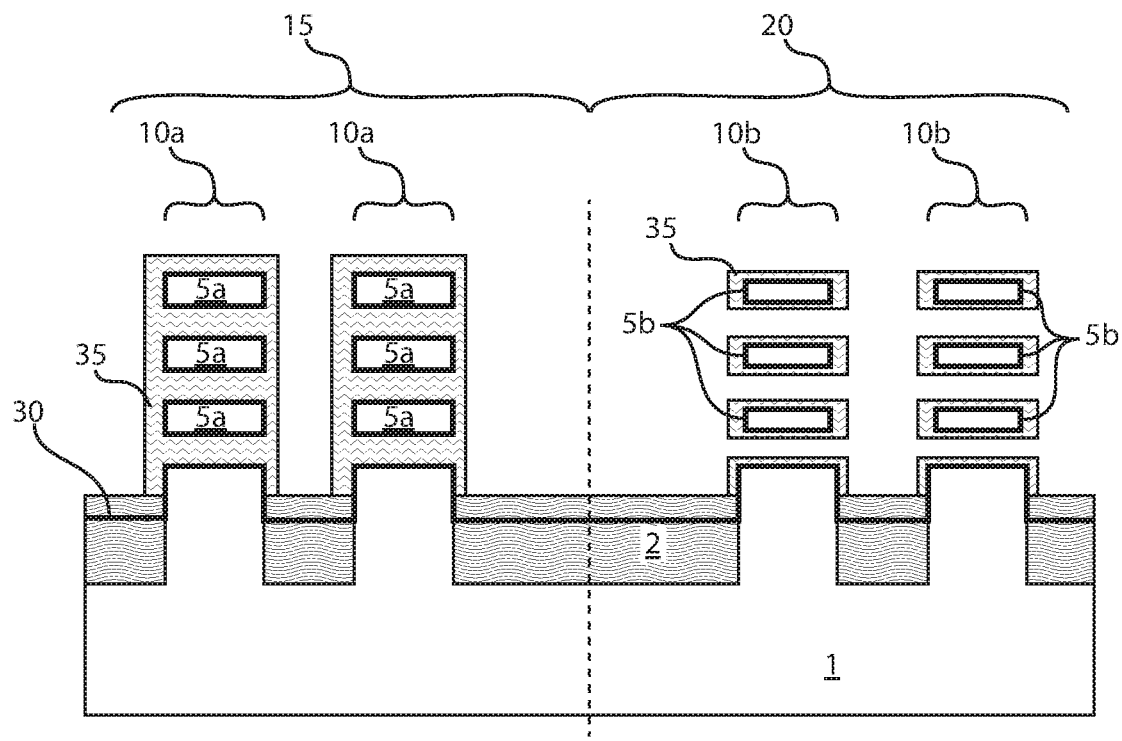
FIG. 6 is a side cross-sectional view depicting the formation of a high-k gate dielectric layer on structure depicted in FIG. 5 followed by the formation of an extra gate (EG) oxide layer, in accordance with one embodiment of the present disclosure.

In one embodiment, the method continues with the forming a gate structure on the channel region portions of the nanosheets 5a, 5b that are depicted in FIG. 5. In some embodiments, forming the gate structure includes forming a high-k gate dielectric layer 30 directly on the channel region portions of the nanosheets 5a, 5b, as depicted in FIG. 6. The high-k gate dielectric layer 30 is conformally deposited to have a substantially equal thickness on each surface of the channel portion of the nanosheets 5a, 5b that it is formed on.

Referring to FIG. 6, a high k material is a dielectric having a dielectric constant greater than silicon oxide at room temperature, e.g., 20° C. to 25° C. Exemplary high-k dielectrics suitable for the high-k gate dielectric layer 30 include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2ON_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2.

Referring to the FIG. 6, the high-k gate dielectric layer 30 can be formed by chemical vapor deposition (CVD), such as plasma enhanced chemical vapor deposition (PECVD), metal organic chemical vapor deposition (MOCVD), or atomic layer deposition (ALD).

FIG. 6 also depicts forming an extra gate (EG) oxide layer 35 on the high-k dielectric layer 30. As depicted in FIG. 6, the extra gate (EG) oxide layer 35 is formed conformally around an entirety of the nanosheets 5b in the extra gate (EG) region 20 of the substrate 1, but does not pinch off the entirety of the space between the stacked nanosheets 5b. More specifically, following the formation of the extra gate (EG) oxide layer 35 in the extra gate (EG) region 20 a space remains between the adjacently stacked nanosheets 5b. As depicted in FIG. 6, the extra gate (EG) oxide layer 35 that is formed on the nanosheets 5a in the single gate (SG) region 15 pinches off the space between adjacently stacked nanosheets 5a. More specifically, following the formation of the extra gate (EG) oxide layer 35 in the single gate (SG) region 15, the space between the adjacently stacked nanosheets 5a is entirely filled.

The extra gate (EG) oxide layer 35 can be composed of silicon oxide, silicon oxynitride or other oxide containing dielectrics as used in the gate structure of semiconductor devices. The extra gate (EG) oxide layer 35 may be formed using any deposition process that provides that the extra gate (EG) oxide layer 35 that is formed on the nanosheets 5a in the single gate (SG) region 15 pinches off the space between adjacently stacked nanosheets 5a; and provides that the extra gate (EG) oxide layer 35 that is formed on the nanosheets 5b in the extra gate (SG) region 20 does not pinch off the space between adjacently stacked nano sheets 5b. More specifically, the extra gate (EG) oxide layer 35 that is formed on the nanosheets 5b in the extra gate (SG) region 20 is conformally deposited on the high-k gate dielectric layer 30. The extra gate (EG) oxide layer 35 can be formed by chemical vapor deposition (CVD), such as plasma enhanced chemical vapor deposition (PECVD), metal organic chemical vapor deposition (MOCVD), or atomic layer deposition (ALD).

Figure 7:
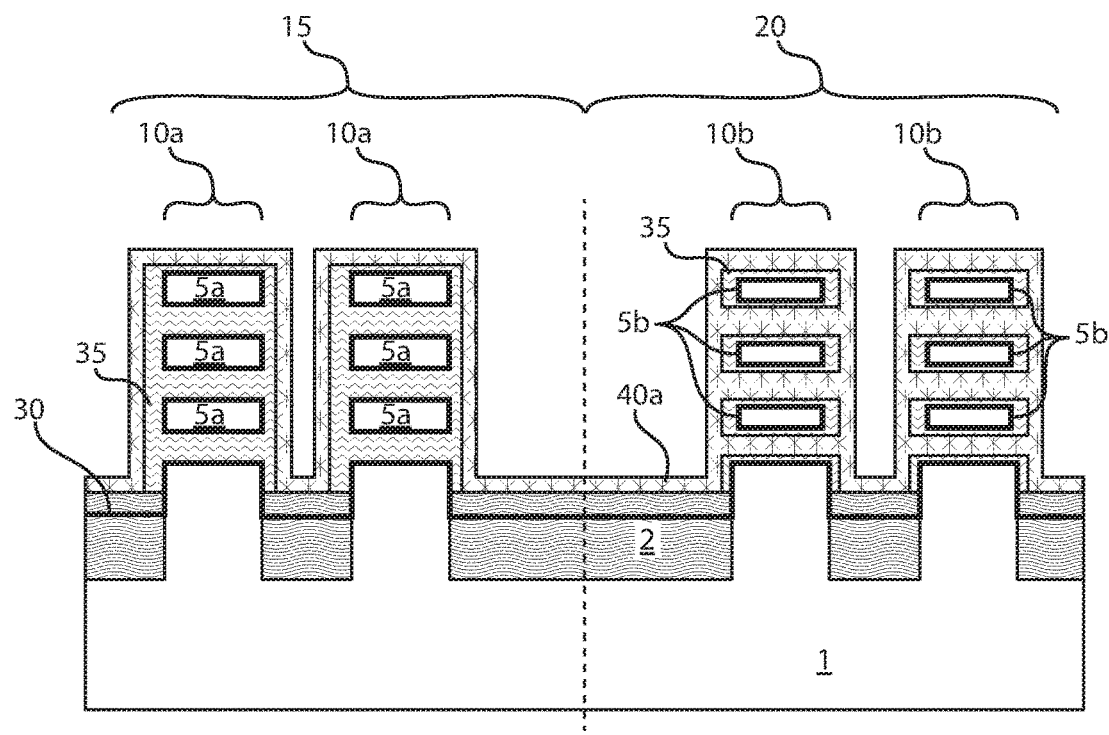
FIG. 7 is a side cross-sectional view depicting forming a work function metal layer on the structure depicted in FIG. 6.

FIG. 7 illustrates one embodiment of forming a work function metal layer 40a on the structure depicted in FIG. 6.

The work function metal 40a may be selected to provide a p-type work function metal layer and an n-type work function metal layer. As used herein, a "p-type work function metal layer" is a metal layer that effectuates a p-type threshold voltage shift. In one embodiment, the work function of the p-type work function metal layer ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero. In one embodiment, the p-type work function metal layer may be composed of titanium and their nitrided/carbide. In one embodiment, the p-type work function metal layer is composed of titanium nitride (TiN). The p-type work function metal layer may also be composed of TiAlN, Ru, Pt, Mo, Co and alloys and combinations thereof.

As used herein, an "n-type work function metal layer" is a metal layer that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In one embodiment, the work function of the n-type work function metal layer ranges from 4.1 eV to 4.3 eV. In one embodiment, the n-type work function metal layer is composed of at least one of TiAl, TiC, TaN, TaC, TiN, HfN, HfSi, or combinations thereof.

The material layers for the work function metal layer 40a may be deposited using physical vapor deposition (PVD), plating or chemical vapor deposition (CVD).

Review of FIG. 7 illustrates that the extra gate (EG) oxide layer 35 that is formed on the nanosheets 5a in the single gate (SG) region 15 pinches off the space between adjacently stacked nanosheets 5a. This means that the work function metal layer 40a can only be formed on the exterior surfaces of the stacks 10a in the single gate (SG) region 15, which provides only a single gate structure. FIG. 7 also illustrates that the extra gate (EG) oxide layer 35 that is formed on the nanosheets 5b in the double gate (SG) region 25 does not pinch off the space between adjacently stacked nanosheets 5b, which provides that the work function metal layer 40a can be deposited to encapsulate each of the nanosheets 5b in a gate all around (GAA) structure. This provides that the double gate region 25 may include multiple gate structures.

FIGS. 11-17 depict yet another embodiment of the present disclosure.

Although not depicted in the supplied figures, a gate electrode may then be formed on the work function metal layer 40a. In various embodiments, the gate electrode is a metal, where the metal may be tungsten (W), tungsten nitride (WN) or combinations thereof. In one or more embodiments, the gate electrode is tungsten (W). In other embodiments, the gate electrode may be doped semiconductor material, such as n-type doped polysilicon. The gate electrode may be deposited by CVD, e.g., plasma enhanced chemical vapor deposition (PECVD). The material layers for the gate electrode 40a may be deposited using physical vapor deposition, such as plating, electroplating, electroless deposition, sputtering and combinations thereof.

The gate electrode is optional and may be omitted.

The gate electrode, the metal work function layer 40a, the extra gate oxide layer 35 and the high-k gate dielectric layer 30 provide a functional gate structure to each stack 10a, 10b of suspended nanosheets 5a, 5b. The functional gate structure operates to switch the semiconductor device from an "on" to "off" state, and vice versa.

Figure 8:
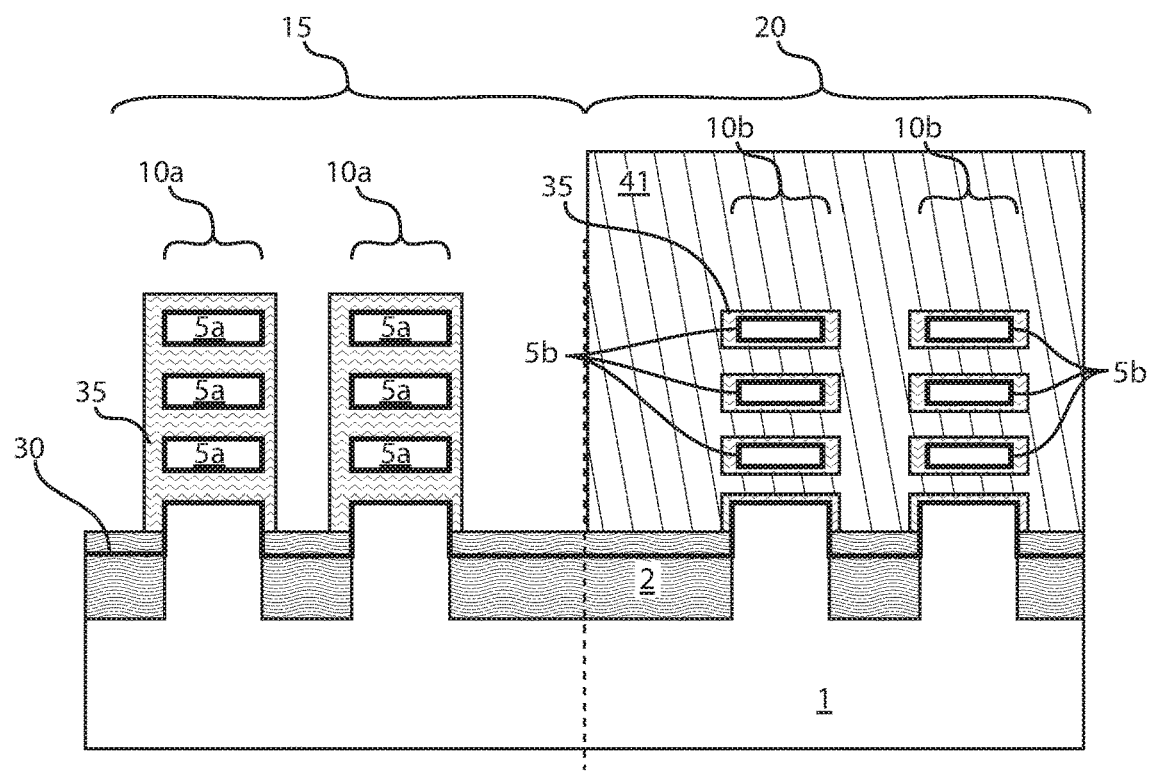
FIG. 8 is a side cross-sectional view depicting another embodiment of a process flow in which beginning with the structure depicted in FIG. 6, a block mask is formed over the extra gate region, leaving the single gate region exposed.
Figure 9:
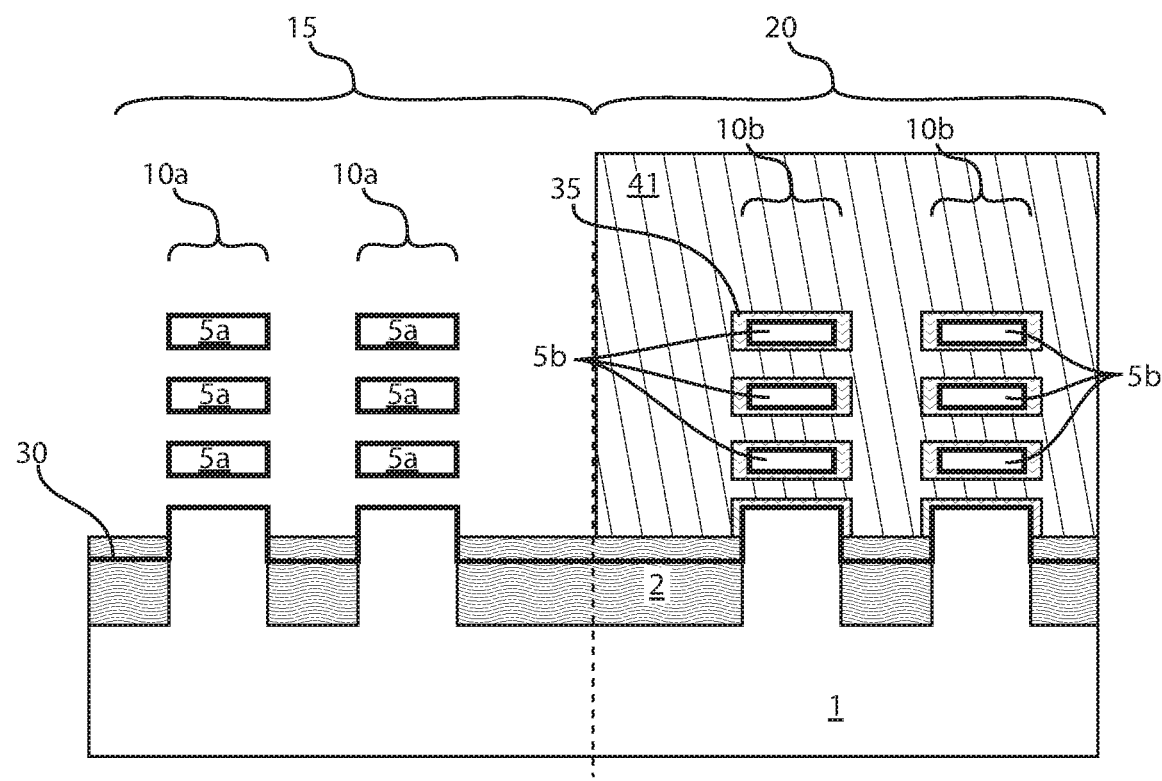
FIG. 9 is a side cross-sectional view depicting removing the extra gate oxide layer from the single gate region of the substrate.
Figure 10:
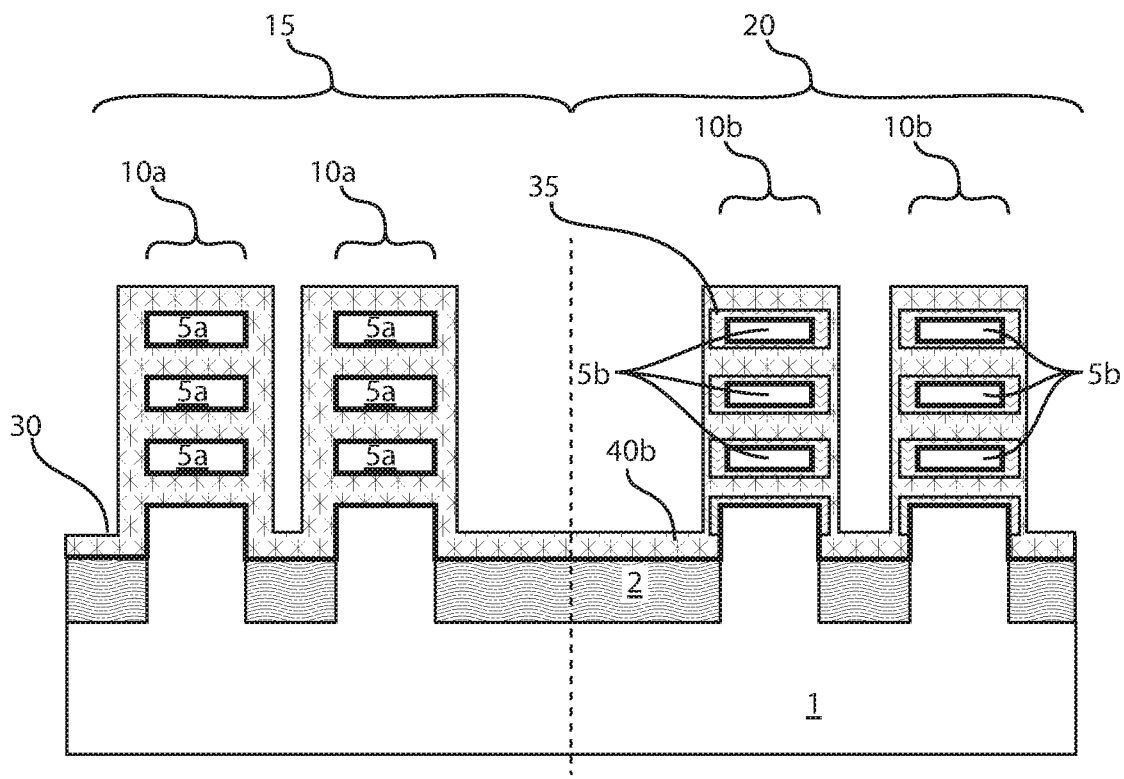
FIG. 10 is a side cross-sectional view depicting forming a work functional metal on the structure depicted in FIG. 9.

FIGS. 8-10 depict another embodiment of the present disclosure. The embodiment that is depicted in FIGS. 8-10 beings with the structure previously described with reference to FIG. 6 and provides for the formation of a nominal gate all around (GAA) device in the single gate region 15, and an extra gate (EG) device in the extra gate (EG) region 20.

FIG. 8 depicts forming a block mask 41 over the extra gate region 20 depicted in FIG. 6, leaving the single gate region 15 exposed. The block mask 41 that is depicted in FIG. 8 is similar to the block mask identified by reference number 25 in FIG. 3. Therefore, the description of the block mask identified by reference number 25 that is depicted in FIG. 3, as well as its method of formation, is suitable for describing at least one embodiment of the block mask identified by reference number 41 in FIG. 8. The block mask 41 that is depicted in FIG. 8 protects the stacks 10b of nanosheets 5b having the extra gate (EG) oxide layer 35 and high-k dielectric layer 30 present thereon within the extra gate (EG) region 20, while exposing the stacks 10a of nanosheets 5a having the extra gate (EG) oxide layer 35 that is present thereon within the single gate (SG) region7 15.

FIG. 9 depicts removing the extra gate oxide layer 35 from the single gate region 15. In some embodiments, the extra gate oxide layer 35 is removed by a selective etch. For example, the extra gate oxide layer 35 can be removed by an etch process that is selective to the high-k gate dielectric layer 30. In some embodiments, the etch process may include reactive ion etching (RIE), plasma etching, wet chemical etching or a combination thereof. Following removal of the extra gate oxide layer 35 from the single gate region 15, the block mask 41 that is present in the extra gate region 20 is removed, e.g., chemically stripped.

Removing the extra gate oxide layer 35 from the stacks 10a of nanosheets 5a within the single gate region 15 removes the material that pinches off the space between adjacently stacked nanosheets 5a. This reopens the space between the adjacently stacked nanosheets 5a in the single gate region 15. The exterior surfaces of the nanosheets 5a within the single gate region 15 are covered by the high-k gate dielectric layer 30.

FIG. 10 depicts forming a work functional metal 40b on the structure depicted in FIG. 9. The work function metal 40b is blanket deposited on the single gate region 15 and the extra gate region 20. The portion of the work function metal layer 40b that is formed in the single gate region 15 is formed directly on the high-k dielectric layer 30 that is present on the exterior surfaces of the nanosheets 5a, wherein the work function metal layer 40b entirely surrounds the nanosheets 5a. The work function metal layer 40b also fills the space between the adjacently stacked nanosheets 5a in the stack 10a of nanosheets in the single gate region 15. Therefore, the work function metal layer 40b that is present within the single gate region 15 of the embodiment that is depicted in FIG. 10 pinches off the space between the adjacently stacked nanosheets 5a in the stack 10a that is present in the single gate region 15. This provides that later deposited material layers, such as gate electrodes, can not be formed between adjacently stacked nanosheets 5a in the stack 10a that is present in the single gate region 15.

The functional gate structures that are formed in the single gate region 15 provide nominal gate all around (GAA) devices in the single gate region 15.

The portion of the work function metal layer 40b that is formed in the extra gate region 20 is deposited in a manner similar to the portion of the work function metal layer 40a that is formed in the extra gate region 20 that is described with reference to FIG. 7. Therefore, the description of the work function metal layer 40a that is depicted in FIG. 7, as well as its method of formation, is suitable for describing the work function metal layer 40b that is depicted in FIG. 10.

A gate electrode (not shown) may be optionally formed on the work function metal layer 40b for each stack 10a, 10b of nanosheets 5a, 5b.

The functional gate structures that are formed in the extra gate region 20 provide extra gate (EG) devices on the channel regions provided by the nanosheets 5b in the extra gate region 20.

Following the formation of the work function metal layer 40b, a gate electrode can be formed for each functional gate structure. The gate electrode, the metal work function layer 40b, the extra gate oxide layer 35 and the high-k gate dielectric layer 30 provide a functional gate structure to each stack 10a, 10b of suspended nanosheets 5a, 5b.

Figure 11:
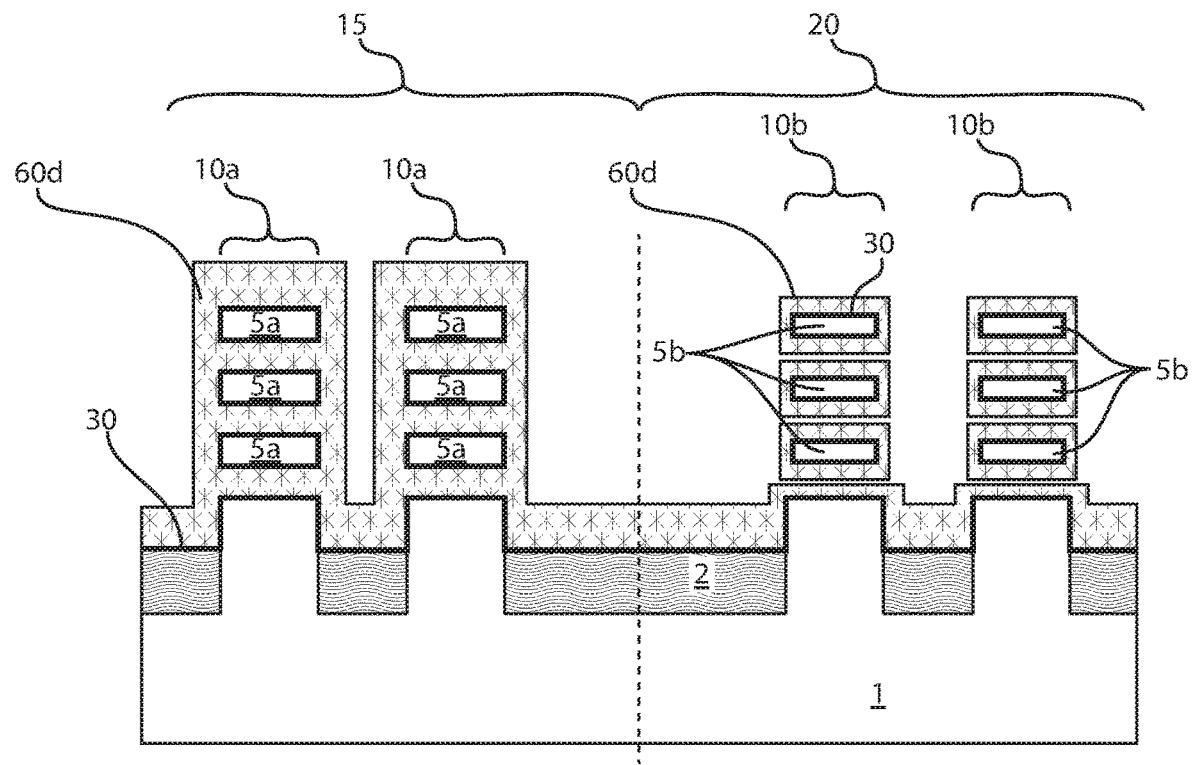
FIG. 11 is a side cross-sectional view of an initial structure in another embodiment of the present disclosure, in which a metal nitride layer is blanket deposited on the structure depicted in FIG. 6 without forming the extra gate oxide layer.

FIGS. 11-17 depict another embodiment of the present disclosure that employs a metal nitride layer 60 to provide a single gate (SG) device and an extra gate (EG) device. FIG. 11 depicts one embodiment of an initial structure in which a metal nitride layer 60 is blanket deposited on the structure depicted in FIG. 6 without forming the extra gate oxide layer at this stage of the process flow.

The metal nitride layer 60 may be composed of titanium nitride (TiN), tantalum nitride (TaN), tungsten nitride or a combination thereof. The titanium nitride layer 60 may be deposited using chemical vapor deposition (CVD) and/or physical vapor deposition (PVD). For example, plasma enhanced chemical vapor deposition (PECVD) may be employed to form the metal nitride layer 60. The metal nitride layer 60 may also be formed using a sputtering method. In further embodiments, the metal nitride layer 60 may be formed using electroplating and/or electroless plating.

Referring to FIG. 11, the metal nitride 60 is formed directly on the high-k dielectric layer 30. As depicted in FIG. 11, the metal nitride 60 is formed conformally around an entirety of the nanosheets 5b in the extra gate (EG) region 20 of the substrate 1, but does not pinch off the entirety of the space between the stacked nanosheets 5b. More specifically, following the formation of the metal nitride layer 60 in the extra gate (EG) region 20, a space remains between the adjacently stacked nanosheets 5b. As depicted in FIG. 11, the metal nitride layer 60 that is formed on the nanosheets 5a in the single gate (SG) region 15 pinches off the space between adjacently stacked nanosheets 5a. More specifically, following the formation of the metal nitride layer 60 in the single gate (SG) region 15, the space between the adjacently stacked nanosheets 5a is entirely filled.

Figure 12:
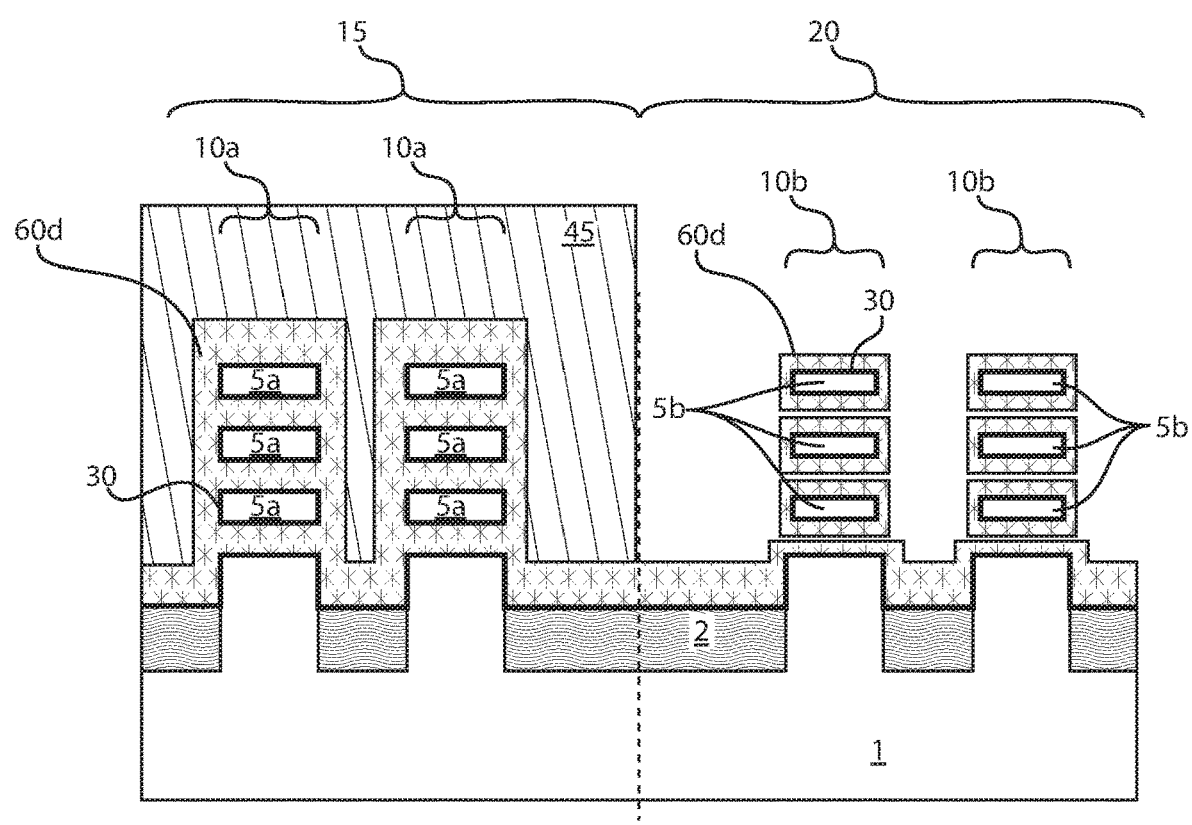
FIG. 12 is a side cross-sectional view depicting forming a block mask over the stack of nanosheets in the single gate region of the device structure depicted in FIG. 11.

FIG. 12 depicts forming a block mask 45 over the stack of nanosheets 5a in the single gate region 15 of the device structure depicted in FIG. 11. The block mask 45 that is depicted in FIG. 12 is similar to the block mask identified by reference number 25 in FIG. 3. Therefore, the description of the block mask identified by reference number 25 that is depicted in FIG. 3, as well as its method of formation, is suitable for describing at least one embodiment of the block mask identified by reference number 45 in FIG. 12. The block mask 45 that is depicted in FIG. 12 protects the stacks 10a of nanosheets 5a having the high-k dielectric layer 30 present thereon within the single gate (SG) region 15, while exposing the stacks 10b of nanosheets 5b having the high-k dielectric layer 30 that is present thereon within the single gate (SG) region 15.

Figure 13:
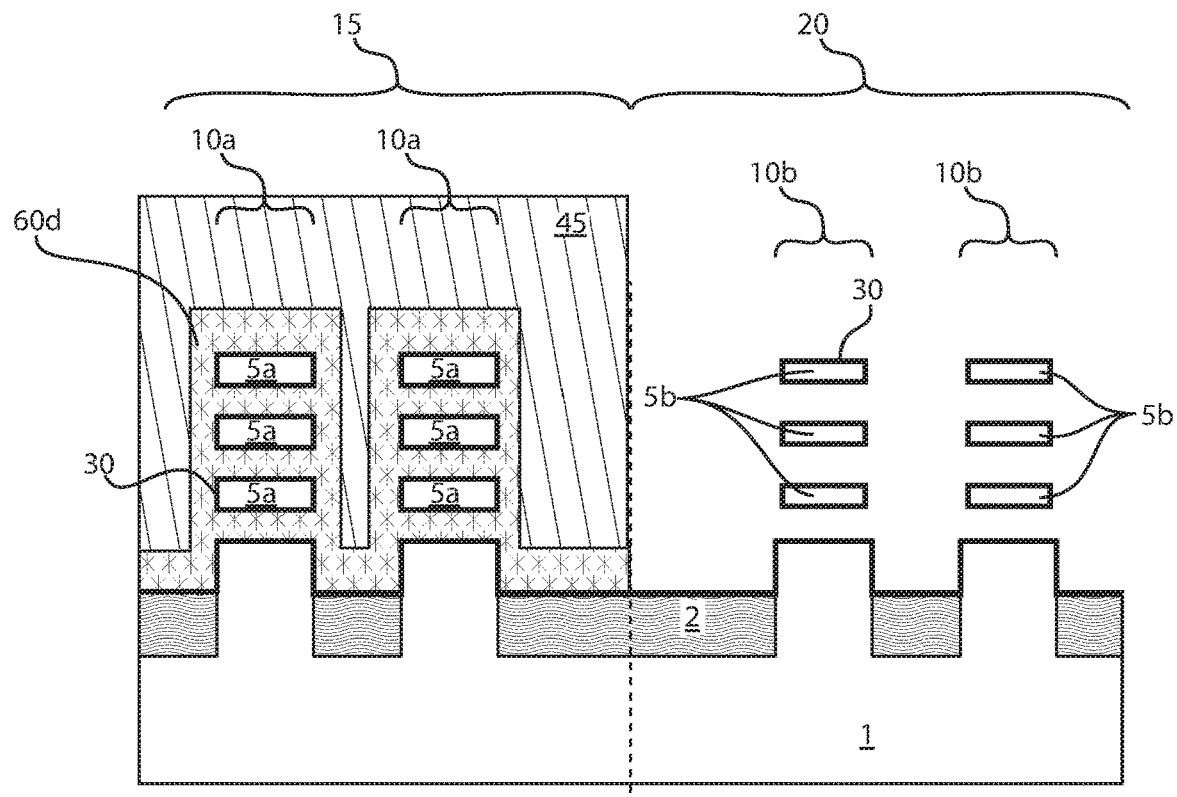
FIG. 13 is a side cross-sectional view depicting removing the exposed portion of the metal nitride layer that is present in the extra gate region of the device structure that is depicted in FIG. 12.

FIG. 13 depicts removing the metal nitride layer 60 from the extra gate region 20. In some embodiments, the metal nitride layer 60 is removed by a selective etch. For example, the metal nitride layer 60 can be removed by an etch process that is selective to the high-k gate dielectric layer 30. In some embodiments, the etch process may include reactive ion etching (RIE), plasma etching, wet chemical etching or a combination thereof. Following removal of the metal nitride layer 60 from the extra gate region 20, the block mask 45 that is present in the single gate region 15 is removed, e.g., chemically stripped, as depicted in FIG. 14.

Figure 14:
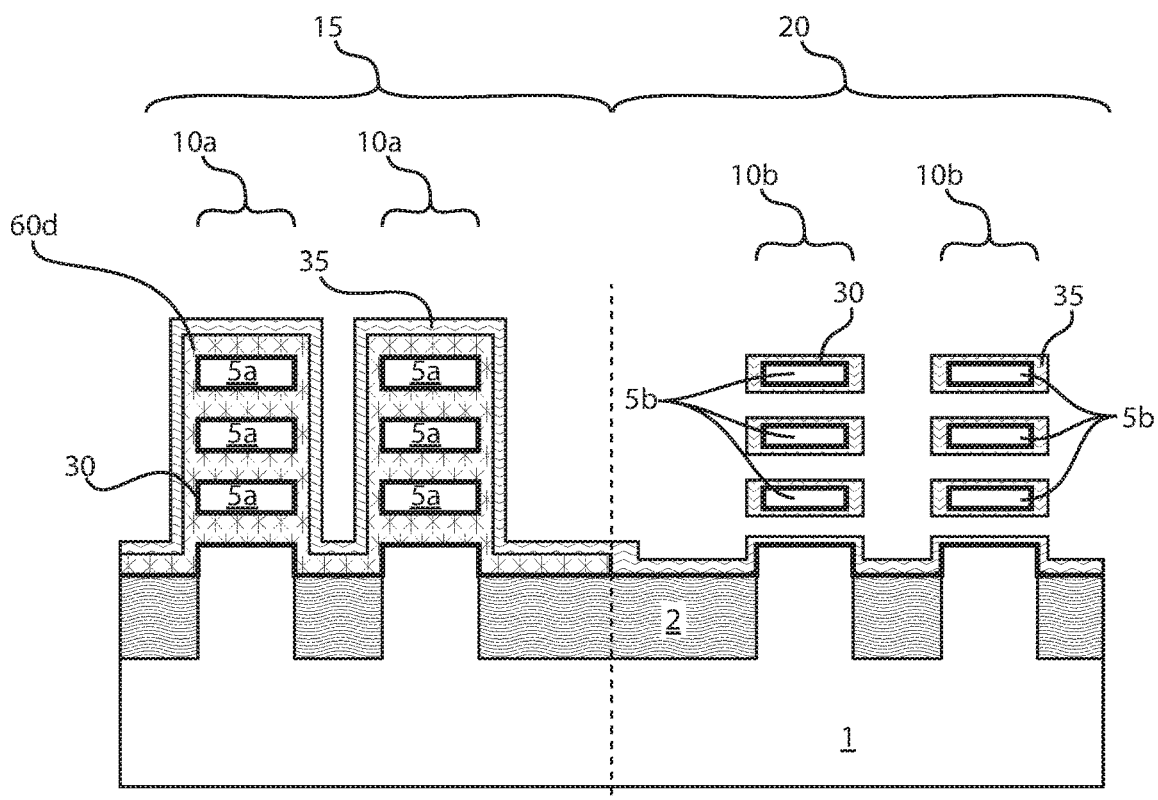
FIG. 14 is side cross-sectional view depicting removing the block mask from the structure depicted in FIG. 13 and forming an extra gate oxide layer.

FIG. 14 also depicts one embodiment of forming an extra gate oxide layer 35. The extra gate oxide layer 35 is formed in both the single gate region 15 and the double gate region 20. The extra gate oxide layer 35 that is depicted in FIG. 14 is similar to the extra gate oxide layer 35 that is described with reference to FIG. 6. Therefore, the description of the extra gate oxide layer 35 that is provided for FIG. 6 is suitable for describing at least one embodiment of the extra gate oxide layer 35 that is depicted in FIG. 14. The extra gate oxide layer 35 is formed around the entirety of the nanosheets 5b within the extra gate region 20, but is obstructed from being formed around the entirety of the nanosheets 5a within the single gate region 15 by the presence of the metal nitride layer 60.

Figure 15:
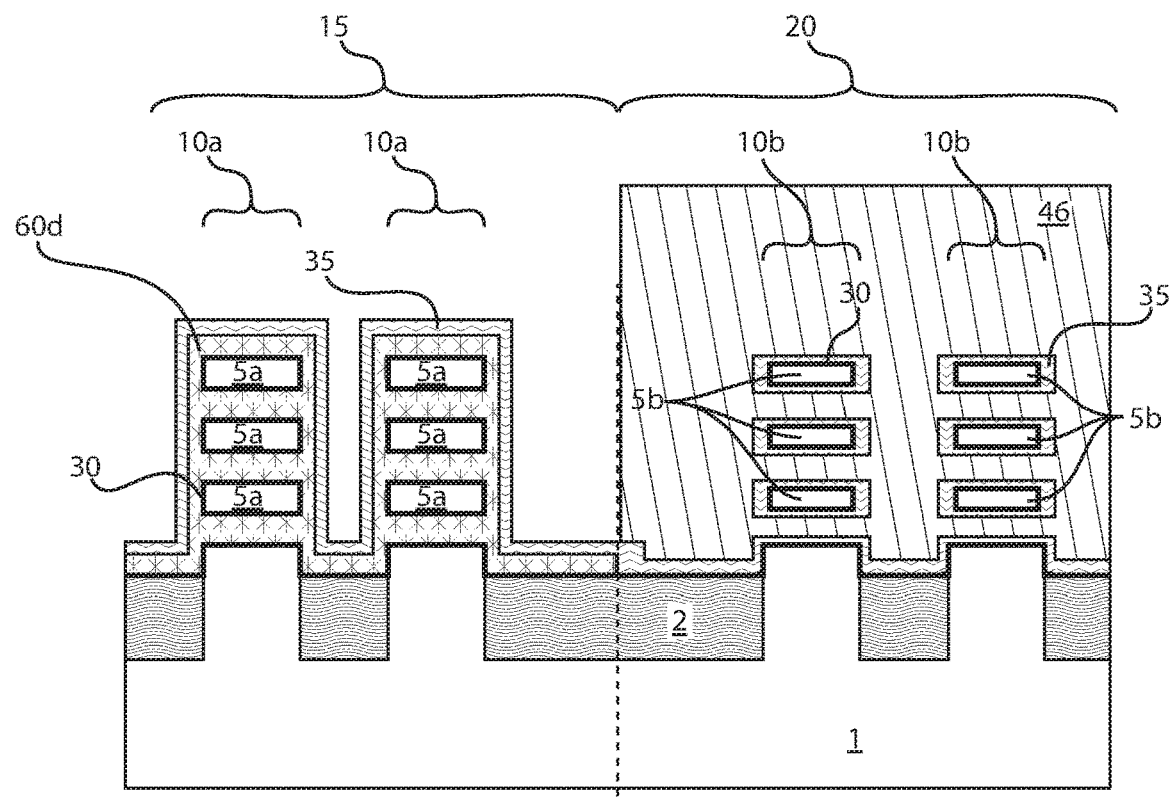
FIG. 15 is a side cross-sectional view depicting forming a block mask over the extra gate region of the substrate leaving the portions of the extra gate oxide layer and the underlying metal nitride layer that are present in the single gate region exposed, in accordance with one embodiment of the present disclosure.

FIG. 15 depicts forming a block mask 46 over the extra gate region 20 of the substrate leaving the portions of the extra gate layer 35 and the underlying metal nitride layer 60 that are present in the single gate region 15 exposed. The block mask 46 that is depicted in FIG. 15 is similar to the block mask identified by reference number 25 in FIG. 3. Therefore, the description of the block mask identified by reference number 25 that is depicted in FIG. 3, as well as its method of formation, is suitable for describing at least one embodiment of the block mask identified by reference number 46 in FIG. 15.

Figure 16:
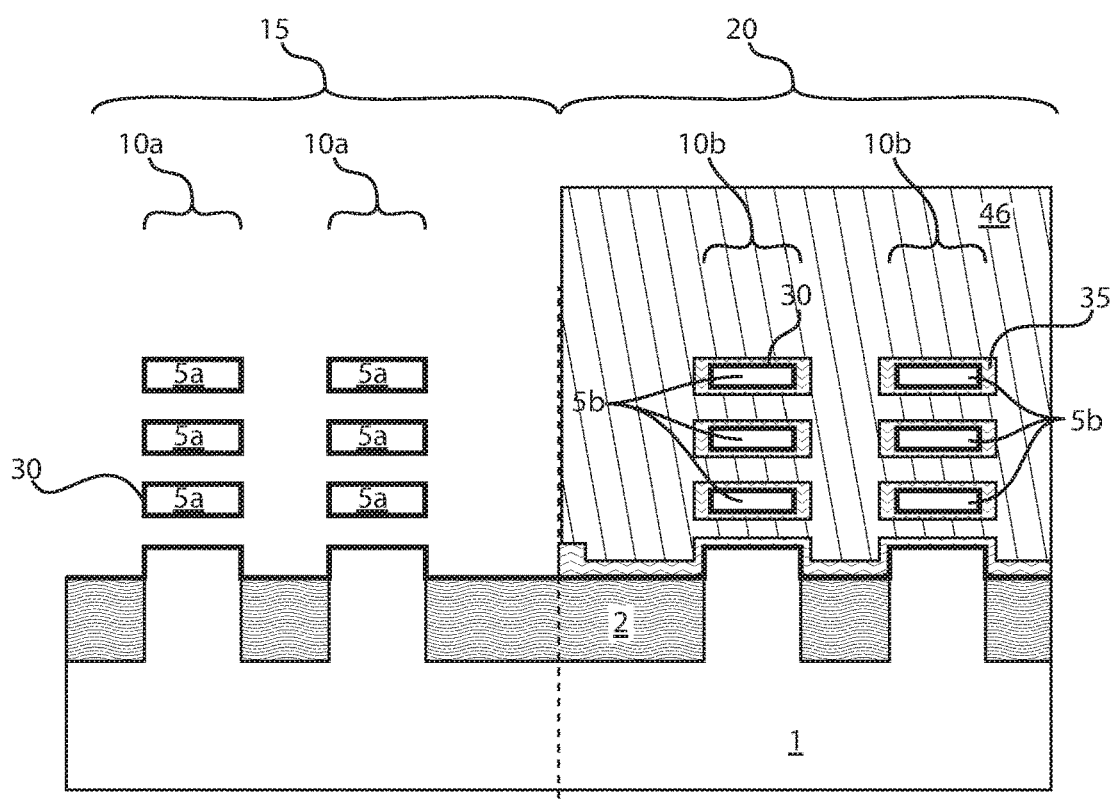
FIG. 16 is a side cross-sectional view depicting one embodiment of removing the portions of the extra gate oxide layer and the underlying metal nitride layer that are present in the single gate region.

FIG. 16 depicts one embodiment of removing the portions of the extra gate oxide layer 35 and the underlying metal nitride layer 60 that are present in the single gate region 15. In some embodiments, the extra gate oxide layer 35 and the metal nitride layer 60 is removed by a selective etch. For example, the metal nitride layer 60 can be removed by an etch process that is selective to the high-k gate dielectric layer 30. In some embodiments, the etch process may include reactive ion etching (RIE), plasma etching, wet chemical etching or a combination thereof. Following removal of the extra metal nitride layer 60 from the single gate region 15, the block mask 46 that is present in the extra gate region 20 is removed, e.g., chemically stripped.

Removing the metal nitride layer 60 from the stacks 10a of nanosheets 5a within the single gate region 15 removes the material that pinches off the space between adjacently stacked nanosheets 5a. This reopens the space between the adjacently stacked nanosheets 5a in the single gate region 15. The exterior surfaces of the nanosheets 5a within the single gate region 15 are covered by the high-k gate dielectric layer 30.

Figure 17:
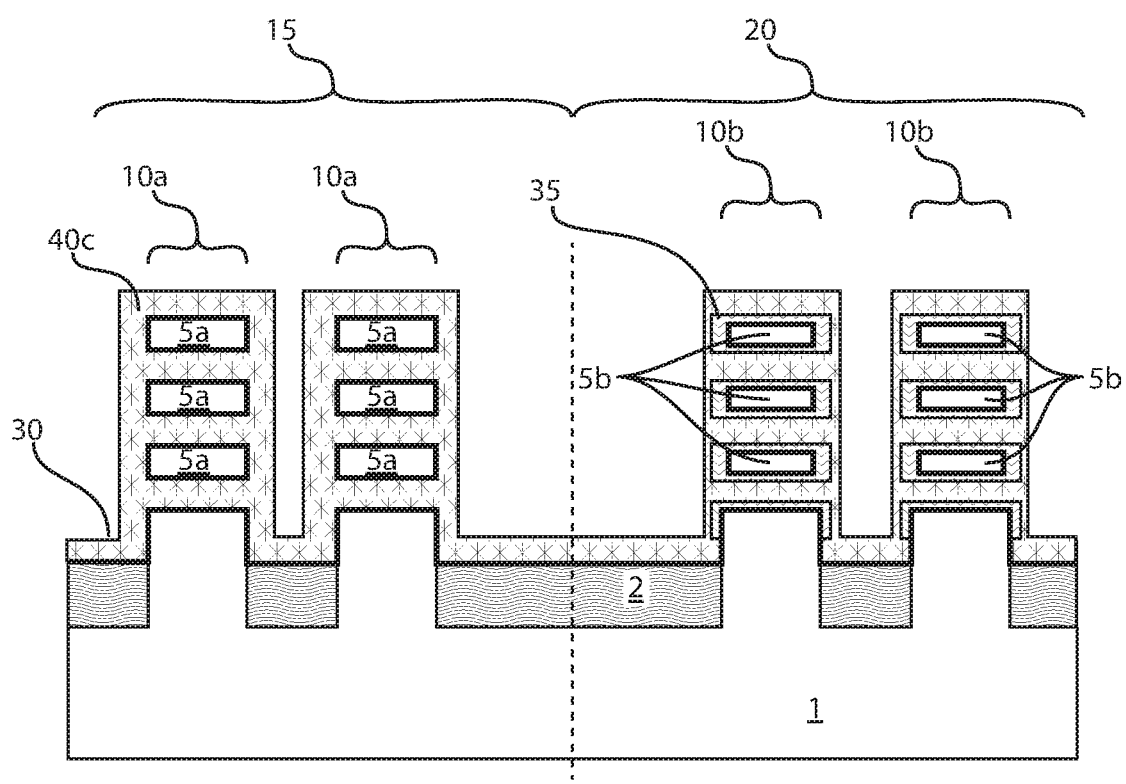
FIG. 17 is a side cross-sectional view depicting forming a work function metal layer on the structure depicted in FIG. 16.

FIG. 17 depicts forming a work functional metal 40c on the structure depicted in FIG. 16. The work function metal 40c is blanket deposited on the single gate region 15 and the extra gate region 20. The portion of the work function metal layer 40b that is formed in the single gate region 15 is formed directly on the high-k dielectric layer 30 that is present on the exterior surfaces of the nanosheets 5a, wherein the work function metal layer 40c entirely surrounds the nanosheets 5a. The work function metal layer 40c also fills the space between the adjacently stacked nanosheets 5a in the stack 10a of nanosheets in the single gate region 15. Therefore, the work function metal layer 40c that is present within the single gate region 15 of the embodiment that is depicted in FIG. 17 pinches off the space between the adjacently stacked nanosheets 5a in the stack 10a that is present in the single gate region 15. This provides that later deposited material layers, such as gate electrodes, can not be formed between adjacently stacked nanosheets 5a in the stack 10a that is present in the single gate region 15.

Following the formation of the work function metal layer 40b, a gate electrode can be formed for each functional gate structure. The gate electrode, the metal work function layer 40b, the extra gate oxide layer 35 and the high-k gate dielectric layer 30 provide a functional gate structure to each stack 10a, 10b of suspended nanosheets 5a, 5b.

Having described preferred embodiments of a methods and structures disclosed herein, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming an electrical device comprising:
providing a first stack of nanosheets having a first thickness and a second stack of nanosheets having a second thickness, wherein the second thickness is less than the first thickness;
forming a dielectric layer on the first and second stack of nanosheets, wherein the dielectric layer fills a space between said nanosheets in the first stack, and is conformally present on the nanosheets in the second stack; and
forming a work function metal layer on the first and second stack of nanosheets, wherein the work function metal layer is present on only exterior surfaces of the first stack to provide a single gate structure and the work function metal layer is conformally present about an entirety of the nanosheets in the second stack to provide a multiple gate structure.

2. The method of claim 1, further comprising:
forming a sacrificial gate structure on each of a first and second material stacks, wherein the first and second material stacks provide the first and second stacks of nanosheets;
forming source and drain regions on opposing sides of the sacrificial gate structure on each of the first and second material stacks;
removing the sacrificial gate structure to expose a channel portion of the first and second material stacks;
removing a sacrificial material layer of the first and second material stacks to nanosheet material layer of the first and second material stacks; and
thinning the nanosheets from the second material stacks to provide the second sheet of nanosheets having the second thickness.

3. The method of claim 2, wherein thinning the nanosheets from the second material stack comprises:
forming a hardmask over the first stack of nanosheets leaving the second stack of nanosheets exposed;
oxidizing an exterior surface of the second stack of nanosheets to provide a surface oxide; and
removing the surface oxide with a selective etch.

4. The method of claim 1, wherein the dielectric layer is an oxide.

5. The method of claim 1, further comprising forming a high-k gate dielectric on the first and second stack of nanosheets.

6. The method of claim 1, wherein the high-k gate dielectric is present around an entirety of an exterior surface for each nanosheets in the first and second stacks of nanosheets.

7. The method of claim 1, wherein the multi-gate structure is a gate all around gate structure.

* * * * *

UNITED STATES PATENT AND TRADEMARK OFFICE
CERTIFICATE OF CORRECTION

PATENT NO. : 10,741,660 B2
APPLICATION NO. : 16/006173
DATED : August 11, 2020
INVENTOR(S) : Loubet et al.

Page 1 of 1

It is certified that error appears in the above-identified patent and that said Letters Patent is hereby corrected as shown below:

On the Title Page

Second inventor's name (72) Inventors: DELETE "Siva Kanakasabapathy" and INSERT --Sivananda Kanakasabapathy--

Signed and Sealed this
Third Day of November, 2020

Andrei Iancu
*Director of the United States Patent and Trademark Office*